(12) United States Patent
Qiu

(10) Patent No.: US 12,368,310 B1
(45) Date of Patent: Jul. 22, 2025

(54) PROTECTIVE SLEEVE FOR EARPHONE CASE

(71) Applicant: HANGZHOU XIYANG E-COMMERCE CO., LTD, Zhejiang (CN)

(72) Inventor: Shanlin Qiu, Zhejiang (CN)

(73) Assignee: HANGZHOU XIYANG E-COMMERCE CO., LTD, Hangzhou (CN)

( * ) Notice: Subject to any disclaimer, the term of this patent is extended or adjusted under 35 U.S.C. 154(b) by 0 days.

(21) Appl. No.: 19/171,369

(22) Filed: Apr. 7, 2025

(30) Foreign Application Priority Data

Feb. 19, 2025 (CN) .......................... 202520267487.3

(51) Int. Cl.
*H02J 7/00* (2006.01)
*H05K 5/00* (2006.01)

(52) U.S. Cl.
CPC .......... *H02J 7/0044* (2013.01); *H05K 5/0086* (2013.01)

(58) Field of Classification Search
None
See application file for complete search history.

(56) References Cited

U.S. PATENT DOCUMENTS

| | | | | |
|---|---|---|---|---|
| 7,673,745 B2* | 3/2010 | Sirichai | ................ | H04B 1/3888 |
| | | | | 206/320 |
| 10,888,039 B2* | 1/2021 | Milevski | ............... | H05K 9/0007 |
| 11,412,823 B2* | 8/2022 | Wright | ................... | A45C 13/02 |
| 11,751,652 B2* | 9/2023 | Wright | ................. | A45C 13/005 |
| | | | | 381/386 |
| 11,758,316 B2* | 9/2023 | Huang | .................. | H02J 7/0044 |
| | | | | 381/74 |
| 11,877,108 B1* | 1/2024 | Xiao | ........................ | H04R 1/02 |
| 12,029,290 B2* | 7/2024 | Hu | ........................ | B29C 51/268 |
| 12,037,822 B1* | 7/2024 | Hyun | .................. | E05B 15/0053 |
| 2020/0100573 A1* | 4/2020 | Ekelund | ............... | A45C 13/005 |
| 2021/0029424 A1* | 1/2021 | Wright | ................. | H04R 1/1025 |
| 2021/0085047 A1* | 3/2021 | Wright | ................. | A45C 11/00 |
| 2022/0000237 A1* | 1/2022 | Mody | ................ | A45C 13/1084 |
| 2022/0400824 A1* | 12/2022 | Zhang | ................ | A45C 13/1084 |

* cited by examiner

*Primary Examiner* — Xanthia C Relford

(57) ABSTRACT

Disclosed is a protective sleeve for an earphone case, including a housing, a housing cover and a connecting member connecting the housing and the housing cover; the housing cover and the housing are respectively provided with an upper chamber and a lower chamber, and the upper chamber and the lower chamber together constitute a chamber for placing the earphone case; and the protective sleeve for the earphone case further includes at least two magnetic groups, wherein each magnetic group includes two magnetic members respectively disposed on the housing cover lower edge and the housing upper edge, and when the housing cover is covered on the housing, the two magnetic members in each magnetic group are magnetically connected, thereby reducing the risk of demagnetization and prolonging the service life of the protective sleeve for the earphone case.

10 Claims, 4 Drawing Sheets

PROTECTIVE SLEEVE FOR EARPHONE CASE

CROSS REFERENCES TO RELATED APPLICATION

The present application claims the benefit of Chinese Patent Application No. 202520267487.3 filed on Feb. 19, 2025, the contents of which are incorporated herein by reference in their entirety.

TECHNICAL FIELD

The present disclosure relates to the technical field of protective sleeves, and more particularly relates to a protective sleeve for an earphone case.

BACKGROUND ART

With the widespread popularity of wireless earphones, in order to improve the portability and protective performance of the wireless earphones, there have been various types of protective sleeves for charging cases of the wireless earphones in the market. For these protective sleeves for the charging cases, magnetic members are generally adopted as connecting means for housings and housing covers to achieve opening and closing. However, in the prior art, there are still certain defects in the magnetic connection of the protective sleeves for the charging cases.

In opening and closing the existing protective sleeves for the charging cases, a single or a small number of magnetic members are generally adopted for adsorption and fixation. However, since magnetic materials are greatly affected by environmental factors (such as temperature changes, and frequent opening and closing), as the service time increases, magnetic forces of the magnetic members will gradually weaken, thereby resulting in reduction in the closing performance, even resulting in the case where the housing cover cannot be firmly closed, and affecting the service experience. Therefore, there is a problem of a high risk of demagnetization in the magnetic connection means of the existing protective sleeves for the charging cases of the wireless earphones.

SUMMARY OF THE INVENTION

An object of the present disclosure is to provide a protective sleeve for an earphone case, which aims at solving the problem of a high risk of demagnetization in a magnetic connection means of a protective sleeve for a charging case in the prior art.

In order to solve the above technical problem, the object of the present disclosure is achieved by the following technical solution: provided is a protective sleeve for an earphone case, including a housing, a housing cover and a connecting member, wherein the housing is connected to the housing cover through the connecting member, and the housing cover and the housing are respectively provided with an upper chamber and a lower chamber; the housing cover includes a housing cover lower edge, the housing includes a housing upper edge, when the housing cover is covered on the housing, the housing cover lower edge is clung to the housing upper edge, and the upper chamber and the lower chamber together constitute a chamber for placing the earphone case; and the protective sleeve for the earphone case further includes at least two magnetic groups, wherein each magnetic group includes two magnetic members respectively disposed on the housing cover lower edge and the housing upper edge, and when the housing cover is covered on the housing, the two magnetic members in each magnetic group are magnetically connected.

Further, the magnetic member is in a radially symmetrical shape.

Further, the at least two magnetic groups are symmetrically disposed along a central axis of the protective sleeve for the earphone case.

Further, at least four magnetic groups are disposed, wherein at least two magnetic groups are disposed close to each other, and at least other two magnetic groups are disposed close to each other.

Further, the housing cover lower edge and the housing upper edge are each provided with an accommodating groove for accommodating the corresponding magnetic member, respectively.

Further, a charging portion is formed at a bottom of the housing, the charging portion includes a charging avoidance hole, a dustproof member and a dustproof connecting rod having elasticity, one end of the dustproof connecting rod is connected to the housing and the other end thereof is connected to the dustproof member, and the dustproof member is located on the charging avoidance hole.

Further, one side of the dustproof member facing the lower chamber is provided with a dustproof plug for blocking a charging port of the earphone case.

Further, the bottom of the housing is further provided with a first sound transmission hole and a second sound transmission hole, respectively, and the first sound transmission hole and the second sound transmission hole are both in a shape of a rounded rectangle.

Further, a side edge of the housing is provided with a light-permeable charging display area, and the charging display area corresponds to an indicator light of the earphone case.

Further, the housing further includes a hanging portion disposed close to the housing upper edge, and the hanging portion includes a hanging through hole and/or a hanging auxiliary hole for externally connecting a rope.

An embodiment of the present disclosure provides a protective sleeve for an earphone case, including a housing, a housing cover and a connecting member, wherein the housing is connected to the housing cover through the connecting member, and the housing cover and the housing are respectively provided with an upper chamber and a lower chamber; the housing cover includes a housing cover lower edge, the housing includes a housing upper edge, when the housing cover is covered on the housing, the housing cover lower edge is clung to the housing upper edge, and the upper chamber and the lower chamber together constitute a chamber for placing the earphone case; and the protective sleeve for the earphone case further includes at least two magnetic groups, wherein each magnetic group includes two magnetic members respectively disposed on the housing cover lower edge and the housing upper edge, and when the housing cover is covered on the housing, the two magnetic members in each magnetic group are magnetically connected. In the present disclosure, the magnetic groups are respectively disposed at positions of the housing cover lower edge and the housing upper edge, and when the housing and the housing cover are covered, the two magnetic members in each magnetic group are magnetically connected, thereby reducing the risk of demagnetization and prolonging the service life of the protective sleeve for the earphone case.

BRIEF DESCRIPTION OF THE DRAWINGS

In order to explain the technical solutions in the embodiments of the present disclosure more clearly, the accompanying drawings to be used in the description of the embodiments will be briefly introduced below. It is apparent that the drawings in the description below are some embodiments of the present disclosure, and for those ordinarily skilled in the art, other drawings may also be obtained according to these drawings without involving any inventive effort.

Figure 1:
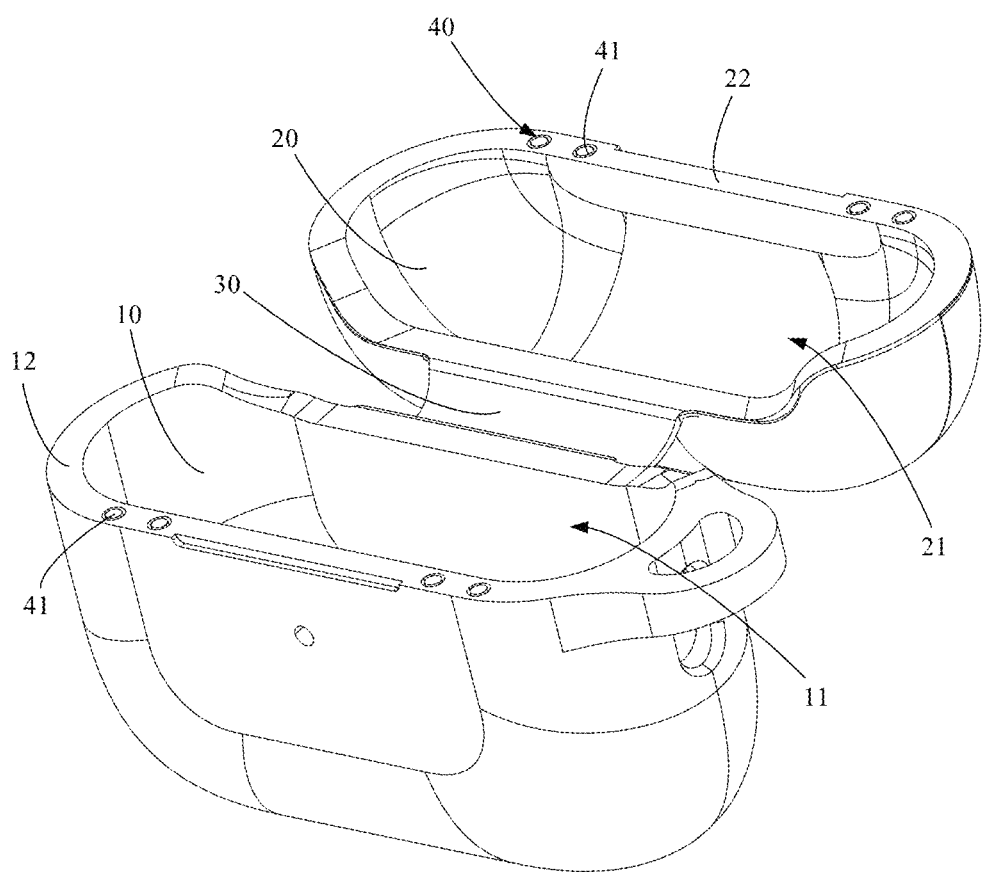
FIG. 1 is a schematic structural diagram I of a protective sleeve for an earphone case provided in an embodiment of the present disclosure.

DESCRIPTION OF REFERENCE NUMERALS IN THE DRAWINGS 10. housing; 11. lower chamber; 12. housing upper edge; 13. charging portion; 131. charging avoidance hole; 132. dustproof member; 1321. dustproof plug; 133. dustproof connecting rod; 14. first sound transmission hole; 15. second sound transmission hole; 16. charging display area; 17. hanging portion; 171. hanging through hole; 172. hanging auxiliary hole;

20. housing cover; 21. upper chamber; 22. housing cover lower edge;

30. connecting member;

40. magnetic group; 41. magnetic member; and 50. accommodating groove.

DETAILED DESCRIPTION OF THE INVENTION

Hereinafter, the technical solutions in the embodiments of the present disclosure will be described clearly and completely in conjunction with the accompanying drawings in the embodiments of the present disclosure. It is apparent that the embodiments described are some embodiments, but not all embodiments of the present disclosure. Based on the embodiments in the present disclosure, all other embodiments obtained by those ordinarily skilled in the art without involving any inventive effort fall within the scope of protection of the present disclosure.

It should be understood that the terms "including" and "containing", when used in this specification and the appended claims, specify the presence of the described features, integers, steps, operations, elements and/or components, but do not preclude the presence or addition of one or more other features, integers, steps, operations, elements, components and/or aggregations thereof.

It should also be understood that the terms used in the specification of the present disclosure herein are for the purpose of describing particular embodiments only and are not intended to limit the present disclosure. As used in the specification and the appended claims of the present disclosure, the singular forms "a", "an" and "the" are intended to include the plural forms as well, unless the context clearly indicates otherwise.

It should also be further understood that the term "and/or" used in the specification and the appended claims of the present disclosure refers to any and all possible combinations of one or more of the associated listed items and includes such combinations.

In conjunction with FIG. 1, an embodiment of the present disclosure provides a protective sleeve for an earphone case, including a housing 10, a housing cover 20 and a connecting member 30, wherein the housing 10 is connected to the housing cover 20 through the connecting member 30, and the housing cover 20 and the housing 10 are respectively provided with an upper chamber 21 and a lower chamber 11; the housing cover 20 includes a housing cover lower edge 22, the housing 10 includes a housing upper edge 12, when the housing cover 20 is covered on the housing 10, the housing cover lower edge 22 is clung to the housing upper edge 12, and the upper chamber 21 and the lower chamber 11 together constitute a chamber for placing the earphone case; and the protective sleeve for the earphone case further includes at least two magnetic groups 40, wherein each magnetic group 40 includes two magnetic members 41 respectively disposed on the housing cover lower edge 22 and the housing upper edge 12, and when the housing cover 20 is covered on the housing 10, the two magnetic members 41 in each magnetic group 40 are magnetically connected.

In this embodiment, the housing 10 and the housing cover 20 are fixedly connected through the connecting member 30. The connecting member 30 enables the housing 10 to firmly match the housing cover 20, and ensures that the housing cover 20 can be effectively covered on the housing 10, thereby protecting the earphone case in the chamber from external damage. In order to ensure that the housing cover 20 and the housing 10 are firmly closed, at least two magnetic groups 40 are designed for the protective sleeve for the earphone case of the present disclosure. Each magnetic group 40 includes two magnetic members 41, wherein these magnetic members 41 are respectively disposed at positions of the housing cover lower edge 22 and the housing upper edge 12. When the housing cover 20 is covered on the housing 10, the two magnetic members 41 in the magnetic group 40 are adsorbed by a magnetic force, so as to achieve firm connection. The design of magnetic connection enables the housing cover 20 and the housing 10 to be closed more tightly, thereby reducing the situations that the protective sleeve cannot be closed normally. The two magnetic members 41 in each magnetic group 40 are respectively disposed on the housing cover lower edge 22 and the housing upper edge 12.

When the earphone case needs to be stored, the earphone case is placed in the lower chamber 11 of the housing 10, and then the housing cover 20 is aligned with and covered on the housing 10. At this time, the housing cover lower edge 22 is clung to the housing upper edge 12, and the magnetic members 41 in the magnetic group 40 are naturally adsorbed and connected. When the earphone case needs to be taken out, the housing cover 20 and the housing 10 can be separated, and magnetic attraction connection between the magnetic members 41 can be disengaged by slightly applying an external force, so as to open the protective sleeve for the earphone case and taking out the earphone case.

Through the design of the magnetic connection, this protective sleeve for the earphone case can ensure stable magnetic connection between the housing cover 20 and the housing 10, thereby reducing the loosening or accidental opening of the housing cover 20 during use. Meanwhile, a plurality of magnetic members 41 are adopted to disperse the risk of demagnetization, so as to ensure that a relatively strong magnetic attraction force can still be maintained after long-term use, thereby improving the durability of the protective sleeve for the earphone case.

In one embodiment, the magnetic member 41 is in a radially symmetrical shape.

In this embodiment, the shape of the magnetic member 41 is radially symmetrical, namely, the magnetic member 41 is symmetrically distributed around a central point or a central axis thereof. Specifically, each portion of the magnetic member 41 is uniformly arranged along a direction radiating outwards from the central point or the central axis. Through this design, the magnetic member 41 is more efficient in use and more adaptable, and especially in application scenes where uniform magnetic force distribution is required, a stable magnetic property of the magnetic member 41 can be ensured, thereby reducing possible problems due to non-uniform distribution. For example, a circular structure is adopted for the magnetic member 41, and the magnetic members 41 are distributed on the housing cover lower edge 22 and the housing upper edge 12. Through the reasonable layout of a plurality of magnetic members 41, the protective sleeve for the earphone case can provide a stable magnetic attraction force during opening and closing, and meanwhile the risk of affecting the overall closing performance after demagnetization of a single magnetic member 41 is reduced.

When the housing cover 20 is covered on the housing 10, the magnetic members 41 in each magnetic group 40 are adsorbed to each other by the magnetic force to achieve closing. Due to the uniform shape, the magnetic member 41 can provide stable magnetic field distribution, so that an adsorption effect is more reliable. Meanwhile, compared with a conventional bar-shaped magnetic member, the magnetic force of the magnetic member 41 in this embodiment is more concentrated in the same area, and the situation of non-uniform attenuation of a magnetic field due to long-term use does not occur, thereby prolonging the service life of the protective sleeve for the earphone case.

In one embodiment, the at least two magnetic groups 40 are symmetrically disposed along a central axis of the protective sleeve for the earphone case.

In this embodiment, in order to ensure stable adsorptive connection between the housing cover 20 and the housing 10, the at least two magnetic groups 40 are symmetrically disposed along the central axis of the protective sleeve for the earphone case. This layout mode ensures the balance of magnetic connection, and avoids the problem of an insufficient adsorption force on one side or non-uniform stress when the housing cover 20 is closed. Each magnetic group 40 includes two magnetic members 41 respectively disposed on the housing cover lower edge 22 (corresponding to the housing cover 20) and the housing upper edge 12 (corresponding to the housing 10). When the housing cover 20 is covered on the housing 10, the corresponding magnetic members 41 are adsorbed by the magnetic force to form stable magnetic connection. The magnetic groups 40 are symmetrically distributed along the central axis of the protective sleeve for the earphone case, namely, at least two magnetic groups 40 are respectively disposed on a left side and a right side of the housing cover lower edge 22 and the housing upper edge 12.

In one embodiment, at least four magnetic groups 40 are disposed, wherein at least two magnetic groups 40 are disposed close to each other, and at least other two magnetic groups 40 are disposed close to each other.

In this embodiment, at least two magnetic groups 40 are disposed close to each other on one side of the protective sleeve for the earphone case, and at least two other magnetic groups 40 are disposed close to each other on the other side thereof, thereby ensuring the symmetry of an overall structure and balancing a magnetic attraction effect. Through the at least four magnetic groups 40, the housing cover 20 can be adsorbed with the housing 10 more firmly when being closed. Under the combined action of a plurality of magnetic groups 40, even if attenuation of the magnetic forces of part of the magnetic members 41 occurs due to long-term use, the overall closing stability can still be maintained.

Figure 2:
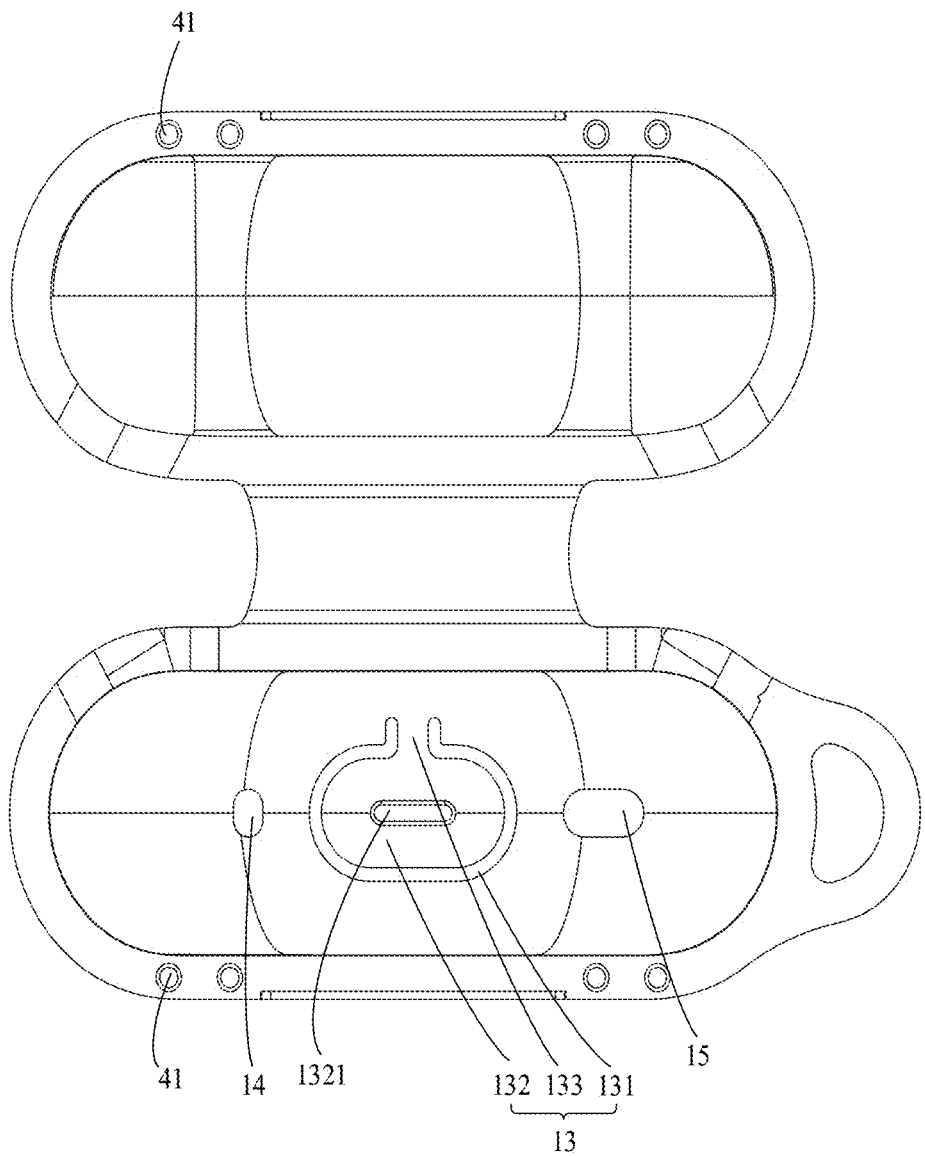
FIG. 2 is a schematic structural diagram II of the protective sleeve for the earphone case provided in an embodiment of the present disclosure.
Figure 3:
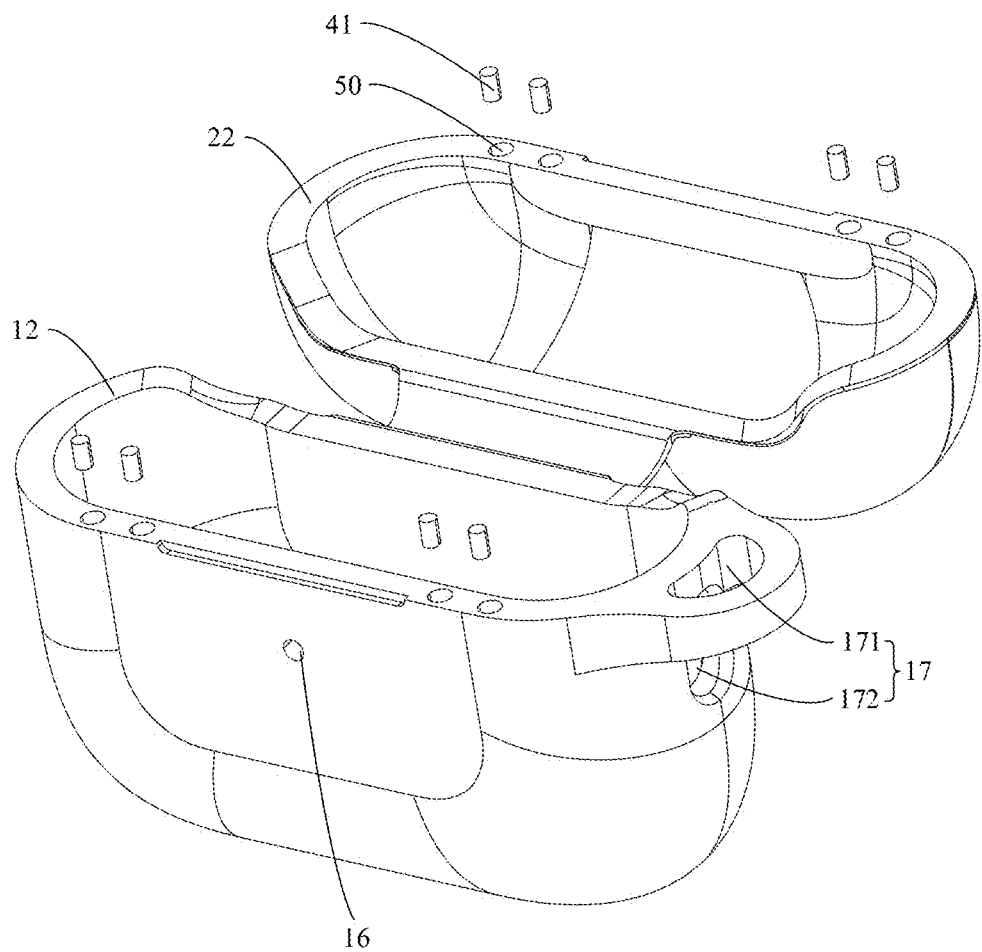
FIG. 3 is an exploded diagram of the protective sleeve for the earphone case provided in an embodiment of the present disclosure.

In conjunction with FIG. 2 and FIG. 3, in one embodiment, the housing cover lower edge 22 and the housing upper edge 12 are each provided with an accommodating groove 50 for accommodating the corresponding magnetic member 41, respectively.

In this embodiment, the housing cover lower edge 22 is provided with at least two accommodating grooves 50 for accommodating the magnetic members 41, respectively, so that the magnetic members 41 can be stably embedded in the housing cover 20. The housing upper edge 12 is provided with an accommodating groove 50 corresponding to the housing cover 20, and the accommodating groove 50 is also used for embedding the magnetic member 41, so as to ensure that the magnetic member 41 can be accurately aligned when the housing cover 20 is closed with the housing 10. The design of the accommodating groove 50 can wrap the magnetic member 41 to prevent the magnetic member 41 from being loosened or detached due to long-term use or external impact. The size of the accommodating groove 50 matches that of the magnetic member 41, so that the magnetic member 41 can be flush with surfaces of the housing cover 20 and the housing 10, thereby ensuring a uniform adsorption force during closing, and improving the closing stability.

In one embodiment, a charging portion 13 is formed at a bottom of the housing 10, the charging portion 13 includes a charging avoidance hole 131, a dustproof member 132 and a dustproof connecting rod 133 having elasticity, one end of the dustproof connecting rod 133 is connected to the housing 10 and the other end thereof is connected to the dustproof member 132, and the dustproof member 132 is located on the charging avoidance hole 131.

In this embodiment, the charging avoidance hole 131 is located at an opening in the bottom of the housing 10, and has a size matching a charging port of the earphone case, so that the earphone case can be charged in a state of being placed inside the protective sleeve for the earphone case. The dustproof member 132 is disposed above the charging avoidance hole 131, and may cover the charging avoidance hole 131 when the earphone case is not charged, so as to prevent dust and impurities from entering the charging port of the earphone case. The dustproof connecting rod 133 having elasticity is used for connecting the dustproof member 132 to the housing 10, so that the dustproof member 132 is still maintained to be connected to the housing 10 after being opened. One end of the dustproof connecting rod 133 is fixed to the housing 10, and the other end thereof is connected to the dustproof member 132, so that the dustproof member 132 may be rotated or flipped open. The dustproof connecting rod 133 is made of an elastic material, so as to have good resiliency, and after the charging is completed, the dustproof member 132 can be automatically reset to cover the charging avoidance hole 131 again, thereby improving a dustproof effect.

During charging by a user, the dustproof member 132 is gently pulled away to be disengaged from the charging avoidance hole 131. Due to a connecting effect of the dustproof connecting rod 133, the dustproof member 132 may not be completely disengaged from the housing 10, but is maintained to be in a certain movement range, so as to be reset after the charging is completed. After the charging avoidance hole 131 is exposed, the user may insert a charging line into the charging port of the earphone case to complete charging operation. After the charging ends, the user pulls out the charging line, and the dustproof member 132 is automatically reset under the elastic action of the dustproof connecting rod 133 to cover the charging avoidance hole 131 again, so as to prevent dust or foreign matter from entering an area of the charging port.

In one embodiment, one side of the dustproof member 132 facing the lower chamber 11 is provided with a dustproof plug 1321 for blocking a charging port of the earphone case.

In this embodiment, the dustproof plug 1321 is made of a flexible material (such as silica gel and rubber), and can adapt to a shape of the charging port of the earphone case, so as to achieve sealed covering, and prevent dust or foreign matter from entering. The dustproof plug 1321 is integrally formed with the dustproof member 132 to ensure that when the dustproof member 132 is opened, the dustproof plug 1321 can also move synchronously without affecting the charging operation.

In an uncharged state, the dustproof member 132 is in a closed state, and the dustproof plug 1321 on the dustproof member 132 blocks the charging port of the earphone case to form sealed protection, so as to prevent dust from entering. When the user needs to charge the earphone case, the dustproof member 132 is gently pulled away, and the dustproof plug 1321 is then disengaged from the charging port of the earphone case, so that the charging port is exposed. When the user pulls out the charging line, the dustproof member 132 is automatically reset under the elastic action of the dustproof connecting rod 133, and the dustproof plug 1321 is reinserted into the charging port of the earphone case, so that secondary sealed protection is achieved.

In one embodiment, the bottom of the housing 10 is further provided with a first sound transmission hole 14 and a second sound transmission hole 15, respectively, and the first sound transmission hole 14 and the second sound transmission hole 15 are both in a shape of a rounded rectangle.

In this embodiment, the first sound transmission hole 14 and the second sound transmission hole 15 each adopt a structure in the shape of the rounded rectangle, and compared with a conventional single circular hole design, the structure in the shape of the rounded rectangle can provide a larger sound transmission area, thereby improving a sound transmission effect. The design of the rounded rectangle enables edges of the sound transmission holes to be smooth and have no sharp angle, so that the machining difficulty can be reduced, the trepanning accuracy is improved, and the influence of edge burrs on sound quality transmission is avoided simultaneously. The first sound transmission hole 14 and the second sound transmission hole 15 are respectively formed in the bottom of the housing 10, so as to ensure that an audio signal can still be smoothly transmitted without being blocked by the structure after the earphone case is placed in the protective sleeve. The layout of the sound transmission holes follows the principle of symmetry, namely, the first sound transmission hole 14 and the second sound transmission hole 15 are respectively located on two sides of the bottom of the housing 10, so that sound can be uniformly distributed, and the problem of an unbalanced sound effect caused by trepanning in a single side can be avoided.

Figure 4:
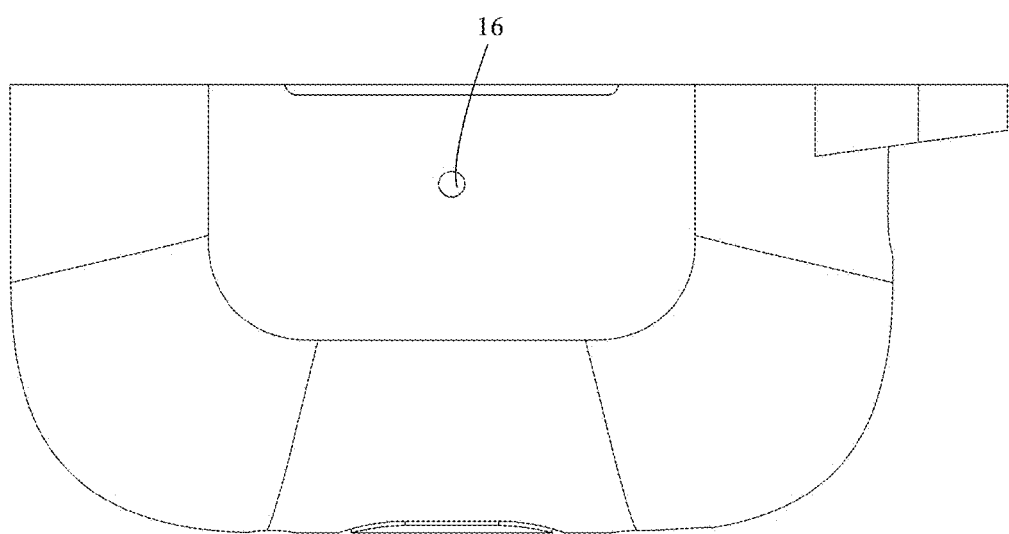
FIG. 4 is a schematic structural diagram III of the protective sleeve for the earphone case provided in an embodiment of the present disclosure.

In conjunction with FIG. 4, in one embodiment, a side edge of the housing 10 is provided with a light-permeable charging display area 16, and the charging display area 16 corresponds to an indicator light of the earphone case.

In this embodiment, the charging display area 16 is made of a light-permeable material (such as frosted PC, PMMA or TPU) to ensure that light of the indicator light can permeate through the protective sleeve, so that the user can intuitively observe a charging state of the earphone case in different light environments. A thickness of the charging display area 16 is optimized to ensure that the charging display area 16 is light-permeable and has certain wear resistance. The charging display area 16 is integrally formed with or separately embedded in the housing 10, so as to ensure smooth appearance and be tightly combined with the overall structure to enhance the durability of the protective sleeve.

In one embodiment, the housing 10 further includes a hanging portion 17 disposed close to the housing upper edge 12, and the hanging portion 17 includes a hanging through hole 171 and/or a hanging auxiliary hole 172 for externally connecting a rope.

In this embodiment, the hanging through hole 171 is used for the rope, a key chain or a metal hook to penetrate through, so that the user can easily fix the protective sleeve to a carry-on article, thereby increasing the convenience in carrying. The hanging auxiliary hole 172 (optional) is used for enhancing the structural stability of the hanging portion 17, or used for connecting an additional accessory, such as an anti-lost chain and a decorative member. If the user needs an additional mounting mode, the hanging auxiliary hole 172 may be used for installing double slings or an additional safety buckle to improve the flexibility in carrying.

The hanging portion 17 is specifically used in the following mode:

a single-point hanging mode (the hanging through hole 171 or the hanging auxiliary hole 172 is used alone):
the user may penetrate the sling, a metal buckle or a key ring through the hanging through hole 171, so that the protective sleeve for the earphone case can be hung on the carry-on article, such as a bag, a waistband or the key chain, so as to facilitate carrying and taking; and
a double-point hanging mode (the hanging through hole 171 and the hanging auxiliary hole 172 are used simultaneously):
if the user wants the protective sleeve for the earphone case to maintain a more stable hanging state, the hanging through hole 171 and the hanging auxiliary hole 172 may be used simultaneously, so that shaking can be reduced and the durability and safety can be improved through the double-point fixing mode.

The above description is merely specific embodiments of the present disclosure, but the scope of protection of the present disclosure is not limited thereto. Any person skilled in the art would have readily conceived of various equivalent modifications or substitutions within the technical scope disclosed in the present disclosure, and these modifications or substitutions should be covered in the scope of protection of the present disclosure. Therefore, the scope of protection of the present disclosure should be determined by the scope of protection of the claims.

The invention claimed is:

1. A protective sleeve for an earphone case, comprising a housing, a housing cover and a connecting member, wherein the housing is connected to the housing cover through the connecting member, and the housing cover and the housing are respectively provided with an upper chamber and a lower chamber; the housing cover comprises a housing cover lower edge, the housing comprises a housing upper edge, when the housing cover is covered on the housing, the housing cover lower edge is clung to the housing upper edge, and the upper chamber and the lower chamber together constitute a chamber for placing the earphone case; and further comprising at least two magnetic groups, wherein each magnetic group comprises two magnetic members respectively disposed on the housing cover lower edge and the housing upper edge, and when the housing cover is covered on the housing, the two magnetic members in each magnetic group are magnetically connected.

2. The protective sleeve for an earphone case according to claim 1, wherein the magnetic member is in a radially symmetrical shape.

3. The protective sleeve for an earphone case according to claim 1, wherein the at least two magnetic groups are symmetrically disposed along a central axis of the protective sleeve for the earphone case.

4. The protective sleeve for an earphone case according to claim 1, wherein at least four magnetic groups are disposed, wherein at least two magnetic groups are disposed close to each other, and at least other two magnetic groups are disposed close to each other.

5. The protective sleeve for an earphone case according to claim 1, wherein the housing cover lower edge and the housing upper edge are each provided with an accommodating groove for accommodating corresponding magnetic member, respectively.

6. The protective sleeve for an earphone case according to claim 1, wherein a charging portion is formed at a bottom of the housing, the charging portion comprises a charging avoidance hole, a dustproof member and a dustproof connecting rod having elasticity, one end of the dustproof connecting rod is connected to the housing and the other end of the dustproof connecting rod is connected to the dustproof member, and the dustproof member is located on the charging avoidance hole.

7. The protective sleeve for an earphone case according to claim 6, wherein one side of the dustproof member facing the lower chamber is provided with a dustproof plug for blocking a charging port of the earphone case.

8. The protective sleeve for an earphone case according to claim 1, wherein the bottom of the housing is further provided with a first sound transmission hole and a second sound transmission hole, respectively, and the first sound transmission hole and the second sound transmission hole are both in a shape of a rounded rectangle.

9. The protective sleeve for an earphone case according to claim 1, wherein a side edge of the housing is provided with a light-permeable charging display area, and the charging display area corresponds to an indicator light of the earphone case.

10. The protective sleeve for an earphone case according to claim 1, wherein the housing further comprises a hanging portion disposed close to the housing upper edge, and the hanging portion comprises a hanging through hole and/or a hanging auxiliary hole for externally connecting a rope.

* * * * *